(12) United States Patent
Farahi et al.

(10) Patent No.: US 7,126,976 B2
(45) Date of Patent: Oct. 24, 2006

(54) SOLID STATE LASERS AND A METHOD FOR THEIR PRODUCTION

(75) Inventors: Faramarz Farahi, Charlotte, NC (US); Pedram Leilabady, Charlotte, NC (US)

(73) Assignee: Waveguide Solutions, Inc., Charlotte, NC (US)

(*) Notice: Subject to any disclaimer, the term of this patent is extended or adjusted under 35 U.S.C. 154(b) by 344 days.

(21) Appl. No.: 10/436,530

(22) Filed: May 14, 2003

(65) Prior Publication Data

US 2003/0193982 A1 Oct. 16, 2003

Related U.S. Application Data

(63) Continuation-in-part of application No. 09/803,342, filed on Mar. 9, 2001.

(60) Provisional application No. 60/379,789, filed on May 13, 2002.

(51) Int. Cl.
*H01S 3/092* (2006.01)

(52) U.S. Cl. .......................................... 372/71; 372/69

(58) Field of Classification Search .................. 372/40, 372/46, 43, 96, 71
See application file for complete search history.

(56) References Cited

U.S. PATENT DOCUMENTS

| | | | | |
|---|---|---|---|---|
| 5,488,619 A | * | 1/1996 | Injeyan et al. | 372/12 |
| 5,704,700 A | * | 1/1998 | Kappel et al. | 353/31 |
| 5,966,399 A | * | 10/1999 | Jiang et al. | 372/96 |
| 2002/0146047 A1 | * | 10/2002 | Bendett et al. | 372/40 |

* cited by examiner

*Primary Examiner*—Minsun Oh Harvey
*Assistant Examiner*—Dung Nguyen

(57) ABSTRACT

The present invention relates to a solid-state laser comprising: a) a semiconductor pump laser, b) a lens integrated on the surface of said semiconductor pump laser, c) a packaging material consisting essentially of a spin-on glass material, wherein the spin-on glass material is processable at a process temperature of less than 225° C., and d) a lasing material layer having a highly reflective coating in both sides. The invention also relates to a process for producing such a solid-state laser, which process comprises applying spin-on glass material onto semiconductor wafers having VCSEL pump lasers using different coating methods, such as spin coating, and curing the glass film layer at temperatures <225° C.; printing desired patterning of the material by contact or proximity lithography methods and forming diffractive lens structures to shape the pump laser radiation into the lasing material which constitutes spin-on glass material doped with rare earth elements, such as erbium (Er) and ytterbium (Yb), or with semiconductor nano-particles or quantum dots.

7 Claims, 3 Drawing Sheets

SOLID STATE LASERS AND A METHOD FOR THEIR PRODUCTION

CROSS-REFERENCE TO RELATED APPLICATIONS

This application claims the benefit of priority under 35 U.S.C. 119(c) to U.S. Provisional Application 60/379,789 filed May 13, 2002. This application also claims priority under 35 U.S.C. 120 and is a continuation-in-part of U.S. application Ser. No. 09/803,342, filed Mar. 9, 2001.

FIELD OF THE INVENTION

The present invention relates to solid-state laser drivers, including surface-emitting lasers such as vertical-cavity surface-emitting lasers, and to a method for their production.

BACKGROUND OF THE INVENTION

The use of optically transmitted signals in communication systems is dramatically increasing the throughput rate of data transfer. In a typical network configuration, an electrical signal is converted into an optical signal by either a laser diode or a light emitting diode (LED). The optical signal is then transported through a waveguide, such as an optical fiber, to an optical detector that converts the optical signal into an electronic signal.

A unit can be assembled that incorporates components for performing many of these functionalities in a single module. Such a module may comprise an integrated circuit (IC), one or more light sources such as an LED or a laser diode, and one or more optical detectors such as silicon, InP, InGaAs, Ge, or GaAs photodiode. The optical detector is used to detect optical signals and transform them into electrical waveforms that can be processed by integrated circuitry in the IC. In response, optical signals are output by the light sources, which may be controlled by the circuitry in the IC. The optical detector(s) may be formed, for example, on a silicon, InP, InGaAs, Ge, or GaAs substrate while the optical source(s) are included, for example, on a GaAs, InGaAs, InP, InGaAsP, AlGaAs, or AlGaAsSb substrate. The integrated circuitry can be incorporated into either or both of the two semiconductor chips. The two chips may be bonded together, using for example, flip-chip or conductive adhesive technology.

In many cases, laser diodes are preferred over LEDs as light sources. The laser diode, for example, provides a higher intensity beam than the LED. Additionally, its optical output also has a narrower wavelength spectrum, which is consequently less affected by dispersion caused by transmission through the optical fiber. "Laser diode" is a general term that includes two broad types of lasers. The first type of laser diode is an edge-emitting laser that emits light through an edge of an active region that comprises, for example, a p-n junction layer. The second type of laser diode is a vertical cavity surface-emitting laser (VCSEL).

Simply put, a VCSEL is a laser made of many layers, e.g., 600, which emits light vertically from a lower surface and in a direction parallel to the direction of its optical cavity, as opposed to an edge-emitting type laser structure. VCSELs have advantages over edge-emitting type structures because, for example, the edge-emitting type lasers must be precisely broken or cleaved individually to form each device during manufacturing. However, with VCSELs, literally millions of laser devices can be made simultaneously in an etching process.

A typical VCSEL comprises a plurality of layers of semiconductor material stacked on top of each other. A region centrally located within the stack corresponds to the active region comprising a p-n junction formed by adjacent p- and n-doped semiconductor layers. This active region is conventionally interposed between two distributed Bragg reflectors (DBRs), each DBR comprising a plurality of semiconductor layers with thicknesses selected so as to facilitate Bragg reflection, as is well-known in the art.

The term "vertical" in Vertical Cavity Surface Emitting Laser pertains to the fact that the planar layers comprising the DBRs and the active region, when oriented horizontally, are such that a normal to the planes faces the vertical direction and light from the VCSEL is emitted in that vertical direction, in contrast with horizontal emission emanating from a side of an edge-emitting laser. VCSELs offer several advantages over edge-emitting lasers, for example, VCSELs are typically much smaller than edge-emitting lasers. Furthermore, VCSELs produce a high intensity output. This latter advantage, however, can be negated if the emitted beam cannot be effectively captured and transmitted to an external location, e.g., via a waveguide. Typically, an optical coupling element such as a lens must be positioned adjacent to and aligned precisely with the VCSEL in order to achieve efficient optical coupling. This process reduces the cost effectiveness of using VCSELs in many instances, especially when a plurality of VCSELs is arranged in a one- or two-dimensional array.

Another advantage afforded by the VCSEL is increased beam control, which is provided by an aperture that is formed in one or more of the semiconductor layers. This aperture is conventionally formed by exposing the stack of semiconductor layers to water vapor to oxidize one of the layers. Initially outer edges of this semiconductor layer begin oxidizing. However, this oxidation progresses inwardly until the water vapor can no longer permeate the layer from the sides, wherein oxidation stops. Thus, a central region of the semiconductor layer remains un-oxidized. When the VCSEL is activated, current will flow through this central region and not the through the surrounding oxide barrier. In this manner, the current flow is confined to a small portion of the active layer. Recombination of electrons and holes within this region causes light to be generated only within a small, localized area within the VCSEL. For the foregoing reasons, this aperture and the layer containing it are conventionally referred to in the art as a current confinement layer.

VCSELs have a range of uses. For example, a specially designed VCSEL has been used to create an optical latch or optical state memory, the VCSEL transitioning and latching in the ON state when an optical input is received. Arrays of such VCSEL's open up possibilities for various massively parallel optical computing applications such as pattern recognition. VCSELs have data communications applications as well as would be clear to one skilled in the art, for example, as transmitters in parallel optical links. For more information about VCSELs, see, for example, "LASERS, Harnessing the Atom's Light," Harbison et al., Scientific American Library, 1998, pages 169–177.

VCSEL arrays are commonly manufactured in a common cathode configuration, i.e., with all the laser cathodes connected together. The VCSEL does not begin lasing until the current through it exceeds a certain laser threshold value. The slope of a curve above this laser threshold is commonly referred to in the art as the differential quantum efficiency (DQE) of the VCSEL.

Vertical cavity surface emitting lasers (VCSELs) include first and second distributed Bragg reflectors (DBRS) formed on opposite sides of an active area. The VCSEL can be driven or pumped electrically by forcing current through the active area or optically by supplying light of a desired frequency to the active area. Typically, DBRs or mirror stacks are formed of a material system generally consisting of two materials having different indices of refraction and being easily lattice matched to the other portions of the VCSEL. In conventional VCSELs, conventional material systems perform adequately.

However, new products are being developed requiring VCSELs which emit light having long-wavelengths. VCSELs emitting light having long-wavelengths are of great interest in the optical telecommunications industry. This long-wavelength light can be generated by using a VCSEL having an InP based active region. When an InP based active region is used, however, the DBRs or mirror stacks lattice matched to the supporting substrate and the active region do not provide enough reflectivity for the VCSELs to operate because of the insignificant difference in the refractive indices between the two DBR constituents.

SUMMARY OF THE INVENTION

The present invention relates to a solid-state laser comprising: a) a semiconductor pump laser, b) a lens integrated on the surface of said semiconductor pump laser, c) a packaging material consisting essentially of a spin-on glass (SOG) material, wherein the spin-on glass material is processable at a process temperature of less than 225° C., (A particularly preferred SOG material is disclosed in copending U.S. application Ser. No. 09/803,342, filed on Mar. 9, 2001.) and d) a lasing material layer having a highly reflective coating in both sides.

The lasing material constitutes spin-on glass material doped with rare earth elements, such as erbium (Er) and ytterbium (Yb), or with semiconductor nano-particles (quantum dots). Quantum dots are tunable band-gap semiconductor nanocrystals. The performance of quantum dots is degraded when exposed to moisture. The spin-on glass material described in this invention provides the necessary moisture resistance for quantum dots to be efficiently deployed in photonic applications. Examples of such quantum dot dopants include lead selenide (PbS) and cadmium selenide (CdS). The lasing material is preferably capable of being pumped by an array of VCSELs at the wavelength that excites the lasing material and a micro-lens is preferably incorporated on the semiconductor pump laser. The lasing material layer can be a pre-determined waveguide or a waveguide formed through the intensity of the pump laser. Preferably, a micro-lens array capable of beam shaping is incorporated on the top layer of solid-state material. The semiconductor pump laser is preferably a vertical cavity surface-emitting layer and an electro-optic layer may be placed in the cavity of the solid state laser, wherein the electro-optic layer is capable of modulating the intensity and wavelength.

The present invention also relates to a process for producing such a solid-state laser, which process comprises: Spin-on glass material is coated on different substrates such as glass, quartz, sapphire, silicon, metalized substrate and polymeric films using different coating methods, such as spin coating, dip coating, spray coating and doctor blade coating. The spin-on glass material soft bakes at 110° C. for 1 hour (hr) and 120° C. for 2 hrs and hard bakes at 150° C. for 3 hrs. For UV curing the sol-gel materials soft baked at 110° C. for 1 hr and at 120° C. for 2 hrs. The purpose of soft baking of material is to reduce or eliminate material stickiness. In this process, the solvent is evaporated from the material and the molecular weight of the silicone part of the material increases. Monitoring heating temperature and heating time are very crucial, since materials may cure at higher temperature or extended time. The UV curing can be done at 365 nm or 254 nm using appropriate initiators. For 365 nm UV exposure, Lucerin OT or other initiators sensitive to 365 nm can be used. Initiators sensitive to deep UV such as Irgacure 284 and Irgacure 819, dimethylbezin, benzoylbiphenyl, at 1–10% can be used for 254 nm curing. Desired patterning of the material may be printed via contact or proximity lithography methods. The material must post-exposure bake at 100 ° C.–120° C. for 30–60 minutes. After the material is cooled to room temperature, the non exposed area of the coated spin-on glass may be removed by developing in an organic solvent, such as tetrahydrofuran, methylethylketone, or n-propylacetate. The material may then be dried by flushing with nitrogen and hard baked at between 120° C. and 180° C., depending on the thickness of the patterned material.

In a preferred embodiment of the subject process, crystal wafers or wafers of doped glass are pumped (excited) by a two dimensional array of pump VCSELs that results in a two dimensional array of semiconductor vertical cavity lasers. The resulting solid-state laser design in such that the physical characteristics of a pump laser, which is a surface emitting device, will be maintained with the superior characteristics of a semiconductor laser, which has good spatial and longitudinal mode properties.

Currently, surface emitting lasers are primarily based on semiconductor compound materials and operate using direct injection. Solid-State lasers are also available that use a light-emitting diode (LED) to pump the crystal within a cavity. The present invention provides a solid-state laser that can be fabricated on the wafer scale level and by its nature emits light out of the plane of a surface.

The present invention provides a number of advantages over existing solid-state lasers and VCSELs. They include: (a) the subject solid-state laser can be made in an array form; (b) the subject solid-state laser does not require an external lens for beam shaping; (c) the subject solid-state does possess a stable frequency; (d) the subject invention provides a laser technology that imparts a high quality Guassian beam shape and narrow line-width; (e) the subject invention provides a laser that will be a surface-emitting solid-state laser with an incorporated micro-lens for beam shaping; and (f) the subject invention enables a laser design that can incorporate an internal modulator.

DETAILED DESCRIPTION OF THE PREFERRED EMBODIMENTS AND THE DRAWINGS

Surface emitting laser diodes have become the source of choice for datacom applications because they can be made in the matrix form. In addition, they have good spatial mode quality allowing maximum coupling of light into optical fiber. In the other hand, due to line-width limitation and frequency instability, they have not been implemented for telecom applications. Solid-state lasers, in contrast, have very narrow line-width, but their high price tag and the fact that they are only made as a single device rather than a matrix array have made their application in datacom economically not feasible. The present invention combines the advantages of a VCSEL with those of a solid-state laser.

The preferred embodiments of the present invention utilize a hybrid glass/polymer sol-gel material, i.e., a spin-on-glass (SOG) material. The invention is not limited to a particular SOG material, but it requires a SOG material that can utilize a low process temperature (<225° C.), ease and low cost of fabrication, the ability to be integrated into traditional semiconductor processes, and a level of integration that provides the advantages of the present invention. An example of such a hybrid Sol-Gel material is described in a paper by Fardad et al. (M. Amir Fardad, Oleg V. Mishechkin, and Mahmoud Fallahi, "Hybrid Sol-Gel Materials for Integration of Optoelectronic Components", Journal of Lightwave Technology, Vol. 19, No. 1, January 2001). Details of the fabrication of the material and the process conditions can be found in this application, which is incorporated herein by reference.

Figure 1:
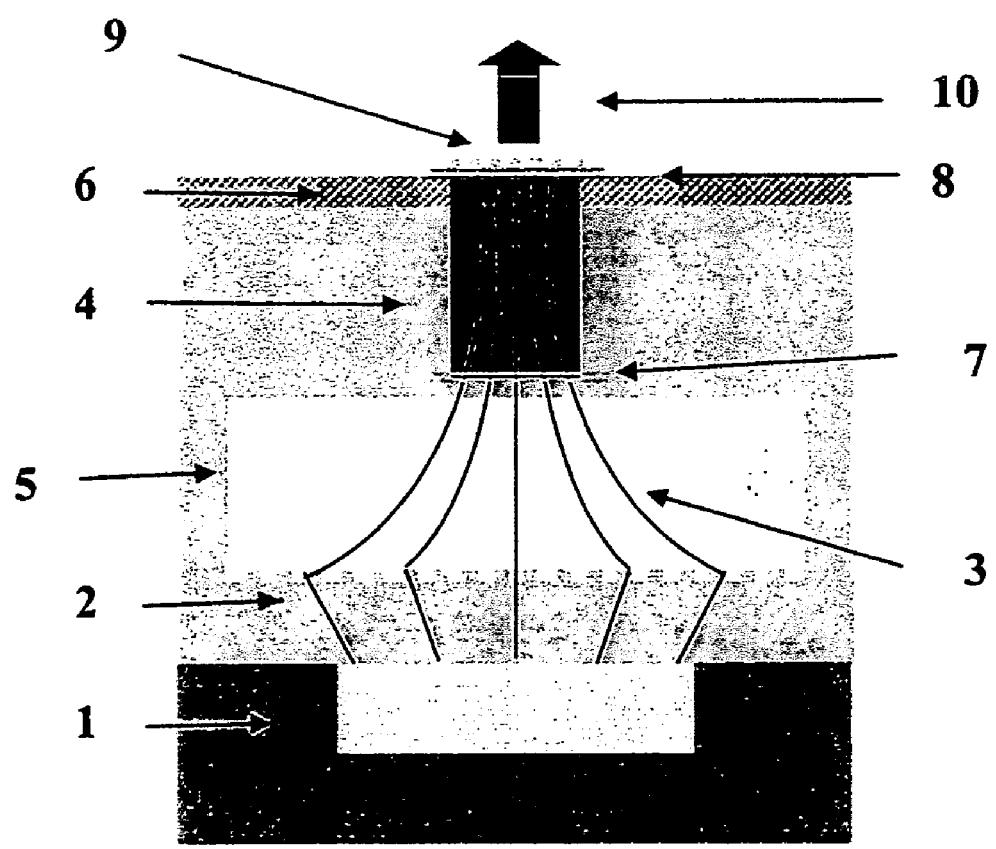
FIG. 1 shows a schematic diagram of the basic design of a single surface-emitting solid-state laser with integrated modulator and lens.

FIG. 1 describes the basic principles of the proposed solid-state laser. It starts from a pump semiconductor laser (1), such as a VCSEL laser that has a micro-lens (2) incorporated over it, to focus the beam (3) in a location where the lasing layer (4) is to be positioned. In this particular example in FIG. 1, the pump laser has a 980 nanometer (nm) wavelength, and the lens is a diffractive lens. The wavelength of the pump laser can be anything that causes excitation of electrons in the lasing medium. A spacer (5) separates the lens from the lasing medium. The lasing medium in this example is an Er doped glass, but the subject invention is not limited to this material and includes any lasing material and crystal that can be used in wafer form. If modulation of the laser is required, a layer of electro-optic material (6) can be placed in the laser cavity. This can be another crystal with electro-optic properties such as: lithium niobate, a layer of electro-optic polymer, etc. Two ends of the laser cavity (7) and (8) have a high reflective coating at the lasing wavelength, which is 1.5 micrometers in this particular example. The micro-lens at the top surface (9) allows beam shaping of the final output (10).

FIG. 1 shows a schematic diagram of the basic design of a single surface emitting solid-state laser with integrated modulator and lens. The lasing region typically forms a waveguide. This waveguide can be either made by increasing the refractive index of that region prior to pumping or could be made as a result of intense optical power in that region depending on the material properties.

Photons from the pump laser are absorbed in the laser medium and excite the electrons to higher level(s). The electrons then de-excite to a meta-stable energy level. Electrons that de-excite from the meta-stable energy level will do so in phase, producing highly coherent optical beam. The presence of electro-optic layer allows the cavity length to be adjusted when a voltage is applied to the EO layer. The adjustment of cavity length results in change of resonance conditions and therefore the system will be in-resonance or out-of-resonance. When in-resonance the laser is "ON" otherwise the laser would be "OFF".

Figure 2:
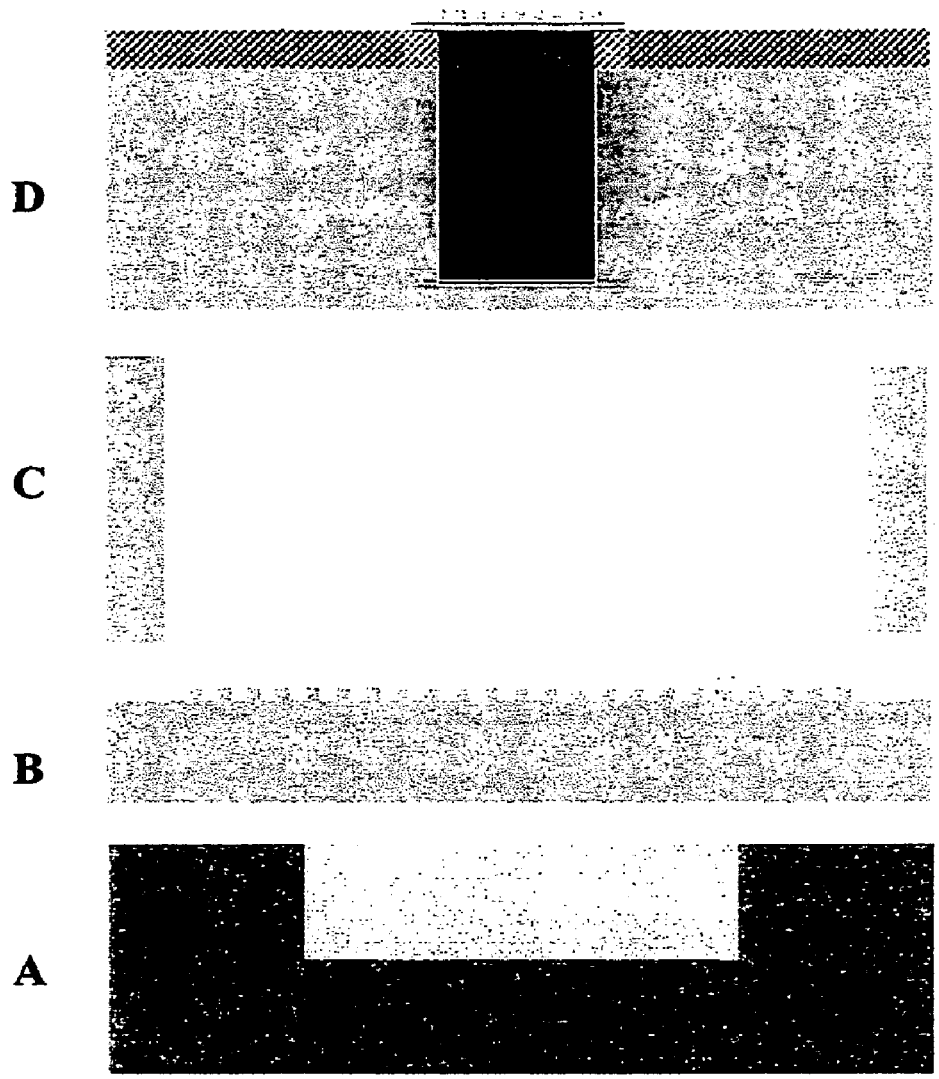
FIG. 2 illustrates the pump vertical cavity laser, the lens that will be integrated on the laser, the packaging that creates required spacing for pump beam to efficiently focus the pump beam in the lasing region, the lasing layer with highly reflective coating in both sides, a micro-lens for beam shaping and an electro-optic layer, if needed.

In FIG. 2, A is the pump vertical cavity laser and B is the lens that will be integrated on the laser. C represents the packaging that creates required spacing for the pump beam to efficiently focus the pump beam in the lasing region. D is the lasing layer with highly reflective coating in both sides, micro-lens for beam shaping, and electro-optic layer if needed.

Figure 3:
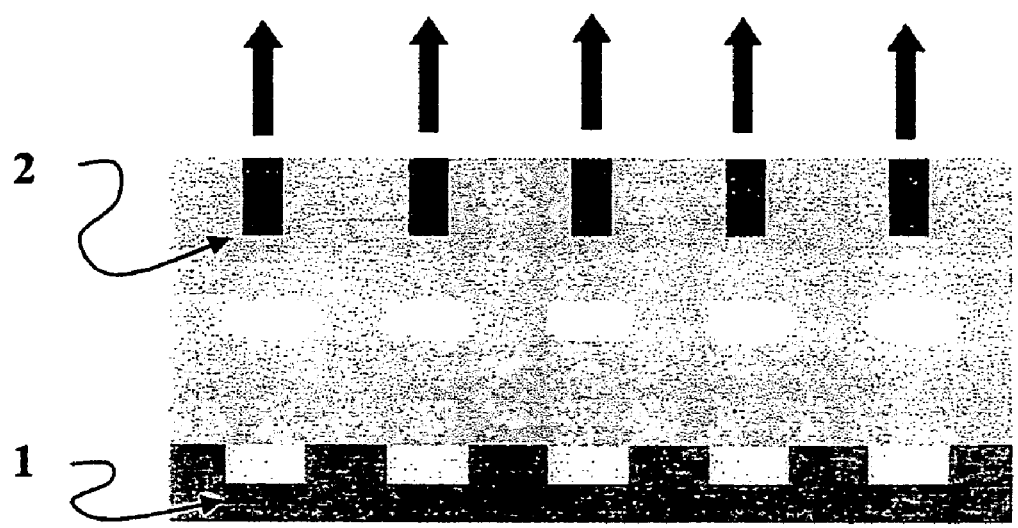
FIG. 3 shows the cross-section of an array of semiconductor lasers.

FIG. 3 shows the cross-section of an array of solid-state lasers. In this case, an array of VCSELs are used as pump lasers (1). It is possible to use more than one pump laser for one lasing region (2), but the example of FIG. 3 shows one pump laser for each lasing region. With this method many lasers can be fabricated on a single wafer. The laser can later be diced to provide many single solid-state surface emitting lasers or a matrix of n-by-m lasers, where n and m are integer numbers.

The invention claimed is:

1. A solid-state laser consisting essentially of: a) a semiconductor pump laser, b) a micro-lens integrated on the surface of said semiconductor pump laser, said pump laser capable of focusing a beam in a location where the lasing layer of d) is to be positioned, c) a packaging material positioned over b) in a manner that creates required spacing for the pump beam to efficiently focus the pump beam in the lasing region, said packaging material consisting essentially of a spin-on glass (SOG) material, wherein the spin-on glass material is processable at a process temperature of less than 225° C. and d) a lasing material layer having a highly reflective coating in both sides, said lasing layer positioned over said spin-on-glass packaging material.

2. The solid-state laser of claim 1, wherein the lasing material is capable of being pumped by an array of VCSELs at the wavelength that excites the lasing material.

3. The solid-state laser of claim 1, wherein the lasing material layer is a pre-determined waveguide.

4. The solid-state laser of claim 1, wherein the lasing material layer is a waveguide formed through the intensity of the pump laser.

5. The solid-state laser of claim 1, wherein a micro-lens array capable of beam shaping is incorporated on the top layer of solid-state material.

6. The solid state laser of claim 1, wherein the semiconductor pump laser is a vertical cavity surface-emitting layer.

7. The solid-state laser of claim 6, wherein an electro-optic loyer is placed in the cavity of the solid-state laser, wherein said electro-optic layer is capable of modulating intensity and wavelength.

* * * * *